US009294037B2

(12) United States Patent
Maurino et al.

(10) Patent No.: US 9,294,037 B2
(45) Date of Patent: Mar. 22, 2016

(54) APPARATUS AND METHODS FOR AUTOZERO AMPLIFIERS

(71) Applicant: ANALOG DEVICES GLOBAL, Hamilton (BM)

(72) Inventors: Roberto S. Maurino, Turin (IT); Venkata Aruna Srikanth Nittala, Bangalore (IN); Abhilasha Kawle, Bangalore (IN); Sanjay Rajasekhar, Bangalore (IN)

(73) Assignee: Analog Devices Global, Hamilton (BM)

( * ) Notice: Subject to any disclaimer, the term of this patent is extended or adjusted under 35 U.S.C. 154(b) by 19 days.

(21) Appl. No.: 14/223,650

(22) Filed: Mar. 24, 2014

(65) Prior Publication Data

US 2015/0270805 A1 Sep. 24, 2015

(51) Int. Cl.
*H03F 1/02* (2006.01)
*H03F 3/45* (2006.01)

(52) U.S. Cl.
CPC .............. *H03F 1/02* (2013.01); *H03F 3/45076* (2013.01); *H03F 2200/234* (2013.01); *H03F 2203/45288* (2013.01)

(58) Field of Classification Search
CPC .......................................................... H03F 1/02
USPC ............................................... 330/9; 327/124
See application file for complete search history.

(56) References Cited

U.S. PATENT DOCUMENTS 6,262,626 B1 7/2001 Bakker et al.
6,380,801 B1 4/2002 McCartney
6,476,671 B1 11/2002 Tang
6,657,487 B2 * 12/2003 Lauffenburger et al. ......... 330/9
6,734,723 B2 5/2004 Huijsing et al.
7,091,771 B2 8/2006 Thompson et al.
7,535,295 B1 5/2009 Huijsing et al.
7,764,118 B2 7/2010 Kusuda et al.
7,834,685 B1 11/2010 Pertijs
7,973,596 B2 7/2011 Eschauzier et al.
8,099,073 B1 1/2012 Muller et al.

(Continued)

FOREIGN PATENT DOCUMENTS

WO WO 2013/123358 8/2013

OTHER PUBLICATIONS

Enz et al., "Circuit Techniques for Reducing the Effect of Op-Amp Imperfections: Autozeroing, Correlated Double Sampling, and Chopper Stabilization", Proceedings of the IEEE, vol. 84, No. 11, pp. 1584-1614, Nov. 1996.

(Continued)

*Primary Examiner* — Steven J Mottola
(74) *Attorney, Agent, or Firm* — Knobbe Martens Olson & Bear LLP

(57) ABSTRACT

Apparatus and methods for autozero amplifiers are provided herein. In certain configurations, an autozero amplifier includes at least three transconductance stages and an autozero timing control circuit configured to control an autozero sequence of the transconductance stages. The autozero timing control circuit can stagger autozeroing of the transconductance stages, such that a relatively small amount of the amplifier's amplification circuitry is connected to or disconnected from the amplifier's signal path at any given time. For example, in certain configurations, when one of the transconductance stages in autozeroed over a particular time interval, the remaining transconductance stages can operate in parallel to provide amplification during that time interval.

26 Claims, 5 Drawing Sheets

(56) References Cited

U.S. PATENT DOCUMENTS

| | | | |
|---|---|---|---|
| 8,120,422 | B1 | 2/2012 | Huijsing et al. |
| 8,405,433 | B2 | 3/2013 | Motz et al. |
| 8,681,029 | B1 | 3/2014 | Wang et al. |
| 8,791,754 | B2 | 7/2014 | Lyden et al. |
| 2010/0238058 | A1 | 9/2010 | Scaduto |
| 2011/0316621 | A1 | 12/2011 | Burt et al. |
| 2014/0232456 | A1 | 8/2014 | Huijsing et al. |
| 2015/0288336 | A1 | 10/2015 | Kusuda |

OTHER PUBLICATIONS

Fan et al., "Input characteristics of a chopped multi-path current feedback instrumentation amplifier", IEEE IWASI Dig. Tech. Papers, pp. 61-66, Jun. 2011.
Bakker et al., "A CMOS Nested-Chopper Instrumentation Amplifier with 100-nV Offset", IEEE Journal of Solid-State Circuits, vol. 35, No. 12, pp. 1877-1883, Dec. 2000.
Nguyen et al., "A Time-Interleaved Chopper-Stabilized Delta-Sigma Analog to Digital Converter", 9th Annual Conference on Electronics, Circuits and Systems, vol. 1, pp. 299-302, Feb. 2002.
Eklund et al., "Digital Offset Compensation of Time-Interleaved ADS Using Random Chopper Sampling", ISCAS 2000—IEEE International Symposium on Circuits and Systems, May 2000. 4 pages.
Opris et al., "A Rail-to-Rail Ping-Pong Op-Amp", IEEE Journal of Solid-State Circuits, vol. 31, No. 9, Sep. 1996. 5 pages.
Coln, Michael, "Chopper Stabilization of MOS Operational Amplifiers Using Feed-Forward Techniques", IEEE Journal of Solid-State Circuits, vol. SC-16, No. 6, Dec. 1981. 4 pages.
LTC1150, Linear Technology, "±15V Chopper Stabilized Operational Amplifier with Internal Capacitors." 1991. 11 pages.
LTC Application Note 21, Linear Technology, "Composite Amplifiers." Jul. 1986. 12 pages.
LTC1150, Linear Technology, "± 15V Zero-Drift Operational Amplifier with Internal Capacitors." 1991. 16 pages.
Analog Devices, AD7910/AD7920 Data Sheet, Rev. C, Sep. 2005. Available at: http://www.analog.com/media/en/technical-documentation/data-sheets/AD7910_7920.pdf (accessed Sep. 10, 2015).
Analog Devices, ADA4522-2 Data Sheet, Rev. 0, May 2015. Available at: http://www.analog.com/media/en/technical-documentation/data-sheets/ADA4522-2.pdf (accessed Sep. 10, 2015).
Burt et al., "A Micropower Chopper-Stabilized Operational Amplifier using a SC Notch Filter with Synchronous Integration inside the Continuous-Time Signal Path", IEEE J. Solid-State Circuits, vol. 41, No. 12, pp. 2729-2736, Dec. 2006.
Denison, T., et. al., "A 2uW 100nV/rtHz Chopper-Stabilized Instrumentation Amplifier for Chronic Measurement of Neural Field Potentials," IEEE Journal of Solid-State Circuits. vol. 42, No. 12, Dec. 2007.
Fan et al., "A 21nV/√Hz Chopper-Stabilized Multipath Current-Feedback Instrumentation Amplifier with 2µV Offset", IEEE ISSCC Dig. Tech. Papers, Feb. 2010, pp. 80-81.
Huang, Q. et al., "A 200nV Offset 6.5nV/rtHz Noise PSD 5.6kHz Chopper Instrumentation Amplifier in 1 um Digital CMOS", Solid-State Circuits Conference, pp. 362-363, Feb. 2001.
Kusuda, Y., "Auto Correction Feedback for Ripple Suppression in a Chopper Amplifier", IEEE J. Solid-State Circuits, vol. 45, No. 8, pp. 1436-1445, Aug. 2010.
Ng, K. A., et al., "A CMOS analog frontend IC for portable EEG/ECG monitoring applications." IEEE Transactions on Circuits and Systems-I: Regular Papers, vol. 52, No. 11, pp. 2335-2347, Nov. 2005.
Sakunia, Saket, "Ping-Pong-Pang Instrumentation Amplifier," Dissertation, TU Delft, Sep. 1, 2010.
Tang et al., "A 3µV-Offset Operational Amplifier with 20nV/√Hz Input Noise PSD at DC Employing both Chopping and Autozeroing" IEEE ISSCC Dig. Tech. Papers, Feb. 2002. 2 pages.

* cited by examiner

APPARATUS AND METHODS FOR AUTOZERO AMPLIFIERS

BACKGROUND

1. Field

Embodiments of the invention relate to electronic devices, and more particularly, to autozero amplifiers.

2. Description of the Related Technology

An amplifier, such as an operational amplifier or an instrumentation amplifier, can include autozero circuitry for reducing the amplifier's input offset voltage. For example, in certain implementations an autozero amplifier can include a primary amplifier, an auxiliary amplifier, and a capacitor, and the auxiliary amplifier can operate during an autozero phase to store a voltage across the capacitor to correct for the input offset voltage of the primary amplifier.

Although including autozero circuitry in an amplifier can reduce the amplifier's input offset voltage, the autozero circuitry can also increase area, power, and/or complexity. Furthermore, in certain implementations, autozero circuitry can impact operational performance of the amplifier, such as by generating output glitches or noise.

SUMMARY

In one embodiment, an apparatus includes a plurality of transconductance stages including a first transconductance stage, a second transconductance stage, and a third transconductance stage. Each of the first transconductance stage, the second transconductance stage, and the third transconductance stage each have an autozero mode and an amplification mode. The apparatus further includes an autozero timing control circuit configured to operate the first transconductance stage in the autozero mode during a first time interval, to operate the second transconductance stage in the autozero mode during a second time interval, and to operate the third transconductance stage in the autozero mode during a third time interval. The first time interval, the second time interval, and the third time interval are staggered in time.

In another embodiment, a method of electronic amplification is provided. The method includes providing a differential input voltage to an autozero amplifier. The autozero amplifier includes a plurality of transconductance stages including a first transconductance stage, a second transconductance stage, and a third transconductance stage. The method further includes controlling timing of the plurality of transconductance stages using an autozero timing control circuit, autozeroing the first transconductance stage during a first time interval using the autozero timing control circuit, autozeroing the second transconductance stage during a second time interval using the autozero timing control circuit, and autozeroing the third transconductance stage during a third time interval using the autozero timing control circuit. The first time interval, the second time interval, and the third time interval are staggered in time.

In another embodiment, an autozero amplifier includes a differential input voltage terminal configured to receive a differential input voltage and a plurality of transconductance stages including a first transconductance stage, a second transconductance stage, and a third transconductance stage. The autozero amplifier further includes an autozero timing control circuit configured to control an autozero sequence of the plurality of transconductance stages. The autozero timing control circuit is configured to autozero the first transconductance stage during a first time interval, to autozero the second transconductance stage during a second time interval, and to autozero the third transconductance stage during a third time interval. The first time interval, the second time interval, and the third time interval are different time intervals. During operation of the autozero amplifier at least one transconductance stage of the plurality of transconductance stages is configured to amplify the differential input voltage at any given time.

DETAILED DESCRIPTION OF EMBODIMENTS

Figure 1:
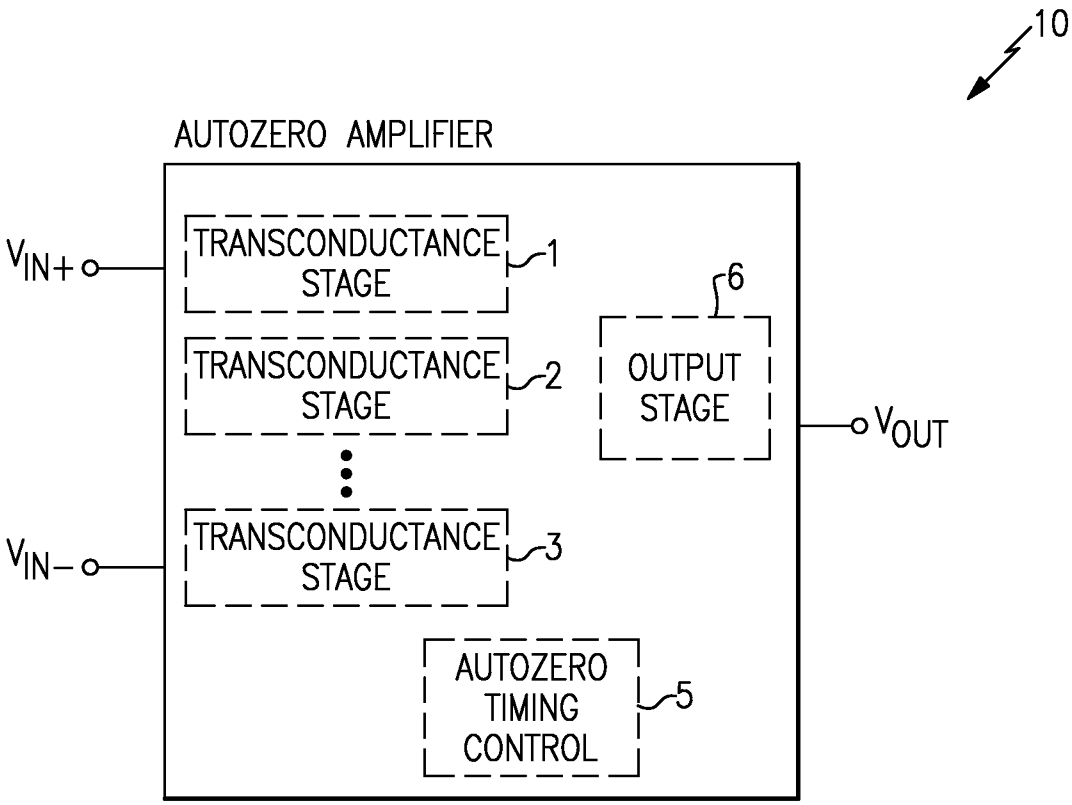
FIG. 1 is a schematic block diagram of one embodiment of an autozero amplifier.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

For certain applications, such as high-precision amplification, it can be desirable for an amplifier to have low input offset and/or small flicker (1/f) noise. To aid in achieving low input offset and/or small flicker noise, certain amplifiers can use autozeroing schemes.

For example, in a ping pong autozero scheme, an amplifier can include two amplification stages that alternate between operating in an autozero mode and an amplification mode. For example, when one amplification stage is disconnected from the amplifier's signal path for autozeroing, the other amplification stage can provide amplification, and vice versa.

Although autozeroing can reduce input offset, certain autozeroing techniques can have a number of drawbacks. For example, in a ping pong autozero scheme, an amplifier can include two amplification stages, which can be duplicates of one another. Since only one amplification stage provides amplification at a time, such an amplifier may have approximately double the power consumption and/or area relative to an amplifier that provides a similar amount of amplification without autozeroing. Additionally, when one amplifier stage is disconnected from the signal path for autozeroing and the other is reconnected to the signal path for amplification, relatively large disturbances can be introduced in the signal path. The signal path disturbances can lead to output glitches and/or noise fold down in the signal band of interest.

Apparatus and methods for autozero amplifiers are provided herein. In certain configurations, an autozero amplifier includes at least three transconductance stages each operable in an autozero mode or an amplification mode. The autozero amplifier further includes an autozero timing control circuit, which interleaves or staggers autozeroing of the transconductance stages. For example, in certain configurations, when a transconductance stage is autozeroed at a particular time instance, the remaining transconductance stages operate in parallel to provide amplification. For example, the transconductance stages active in the amplifier's signal path can generate output currents, which can be summed together to generate a summed current. In certain implementations, the amplifier further includes an output stage that receives the summed current, and generates an output signal of the amplifier.

The autozero amplifiers herein can have small input offset and/or low flicker noise. Additionally, the autozero amplification schemes described herein can have a relatively small impact on the amplifier's size, power consumption, and/or amplification characteristics relative to certain other autozeroing techniques, such as ping pong autozeroing schemes. For example, the teachings herein can be used to provide an autozero amplifier in which a relatively small amount of the amplification circuitry is disconnected from or reconnected to a signal path at a given time, and thus the autozero amplifier can have relatively small output glitches and/or noise.

Additionally, in contrast to a ping pong autozero amplifier in which autozeroing circuitry may double the amplifier's size and/or power consumption, the autozero amplifiers described herein can provide autozeroing with a relatively small impact on the amplifier's area and/or power consumption. For instance, in certain implementations, an autozero amplifier includes n transconductance stages of which n−1 stages provide signal amplification at a given time, and the autozero amplifier can have an area and/or power consumption that is about n/(n−1) larger relative to an amplifier that provides similar amplification without autozeroing.

In certain embodiments, an autozero amplifier further includes a randomization circuit configured to provide randomization or pseudo-randomization of the autozero sequence in which the transconductance stages are autozeroed. Configuring the autozero amplifier to randomize the autozero sequence can aid in enhancing the amplifier's performance by reducing noise spurs relative to a configuration in which autozeroing is performed in a cyclic or deterministic manner.

Overview of Autozero Amplifiers with Staggered Autozeroing

FIG. 1 is a schematic block diagram illustrating one embodiment of an autozero amplifier 10. The autozero amplifier 10 includes a first transconductance ($G_M$) stage 1, a second transconductance stage 2, a third transconductance stage 3, an autozero timing control circuit 5, and an output stage 6. The illustrated autozero amplifier 10 includes an output voltage terminal $V_{OUT}$ and a differential input terminal including a first or non-inverting input voltage terminal $V_{IN+}$ and a second or inverting input voltage terminal $V_{IN-}$.

In the illustrated configuration, the autozero amplifier 10 can be used to amplify a voltage difference between the non-inverting and inverting input voltage terminals $V_{IN+}$, $V_{IN-}$ to generate an output voltage on the output voltage terminal $V_{OUT}$. However, other configurations are possible, including, for example, configurations in which the amplifier generates a differential output voltage, a single-ended output current, and/or a differential output current.

Although FIG. 1 illustrates the autozero amplifier 10 as including three transconductance stages, the teachings herein are also applicable to amplifiers including additional transconductance stages, such as four or more transconductance stages.

The first, second, and third transconductance stages 1-3 can each be used to generate an output current that changes in relation to the voltage difference between the non-inverting and inverting input voltage terminals $V_{IN+}$, $V_{IN-}$. When multiple transconductance stages are active and providing amplification, the active transconductance stages can generate output currents which can be summed together.

Additionally, in the illustrated configuration, the autozero amplifier 10 includes the output stage 6, which can receive the summed current, and generate the output voltage on the output voltage terminal $V_{OUT}$. In one embodiment, the output stage 6 can include a transimpedance amplification circuit. However, other configurations are possible.

An amplifier can undesirably have an input offset voltage. As used herein, an amplifier's input offset voltage can refer to a DC voltage between the amplifier's input terminals that corresponds to an output voltage of about zero. Absent compensation, input offset voltage can degrade operational performance. For example, an input offset voltage can lead to a finite error voltage when the amplifier is connected using feedback.

In the illustrated configuration, the autozero amplifier 10 includes the autozero timing control circuit 5, which can be used to control time intervals over which the first, second, and third transconductance stages 1-3 are autozeroed to reduce or remove input offset. While illustrated in connection with n=3 or n=4 transconductance stages, the principles and advantages disclosed herein are applicable to autozero amplifiers having a broad range of values for the number n, including 5, 6, etc.

The autozero timing control circuit 5 can be used to control an autozero sequence of the first, second, and third transconductance stages 1-3 such that the time intervals associated with autozeroing are interleaved or staggered in time. For example, in certain configurations, the second and third transconductance stages 2, 3 can operate in parallel to provide amplification when the first transconductance stage 1 is being autozeroed. Additionally, the first and third transconductance stages 1, 3 can operate in parallel to provide amplification when the second transconductance stage 2 is being autozeroed. Furthermore, the first and second transconductance stages 1, 2 can operate in parallel to provide amplification when the third transconductance stage 3 is being autozeroed.

Thus, the illustrated autozero amplifier 10 that has been sliced into multiple input transconductance stages, which are autozeroed over staggered time intervals. Configuring the autozero amplifier 10 in this manner can aid in reducing output glitches associated with connecting and disconnecting transconductance stages from the amplifier's signal path.

For example, the illustrated autozero amplifier 10 can consume less power and/or have a smaller area relative to a ping pong autozero amplifier. For instance, a ping pong autozero amplifier can have about twice the size and power consumption relative to an amplifier of similar amplification that operates without autozeroing. In contrast, the autozero amplifier 10 may increase area and/or power consumption by a smaller amount, since a relatively small amount of the amplifier's amplification circuitry is disconnected at a time for autozeroing.

Additionally, the illustrated autozero amplifier 10 can introduce relatively small glitches on the output voltage terminal $V_{OUT}$ associated with disconnecting or reconnecting a transconductance stage from the amplifier's signal path for autozeroing. For instance, since only a relatively small amount of the amplifier's amplification circuitry is disconnected or reconnected to the amplifier's signal path a time, the autozero amplifier 10 can have relatively small output glitches and/or noise relative to certain ping pong autozero amplifiers.

Figure 2A:
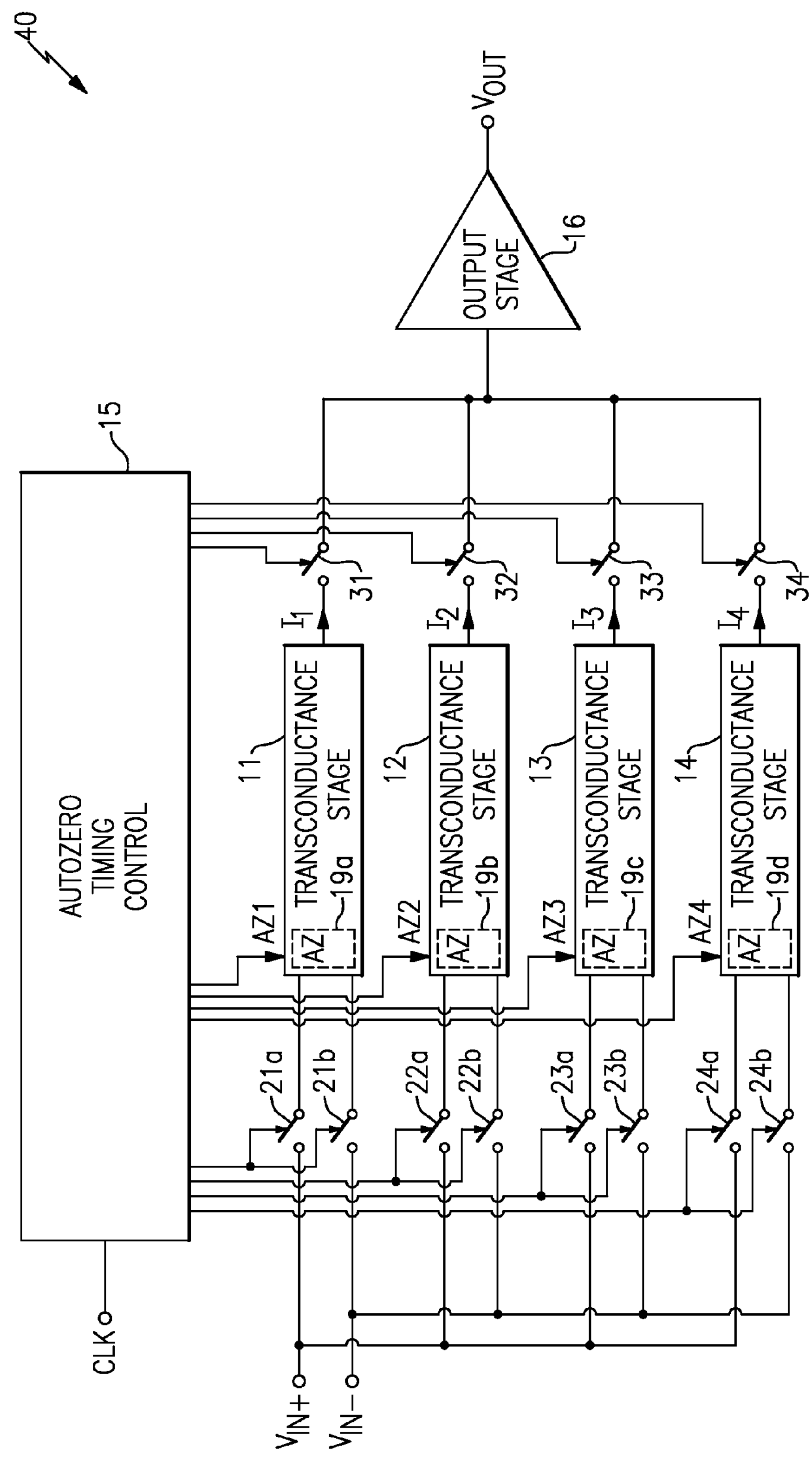
FIG. 2A is a schematic block diagram of another embodiment of an autozero amplifier.

FIG. 2A is a schematic block diagram of another embodiment of an autozero amplifier 40.

The autozero amplifier 40 includes a first transconductance stage 11, a second transconductance stage 12, a third transconductance stage 13, a fourth transconductance stage 14, an autozero timing control circuit 15, an output stage 16, a first pair of input switches 21*a*, 21*b*, a second pair of input switches 22*a*, 22*b*, a third pair of input switches 23*a*, 23*b*, a fourth pair of input switches 24*a*, 24*b*, a first output switch 31, a second output switch 32, a third output switch 33, and a fourth output switch 34. The autozero amplifier 40 further includes a non-inverting input voltage terminal $V_{IN+}$, an inverting input voltage terminal $V_{IN-}$, and an output voltage terminal $V_{OUT}$.

Although FIG. 2A illustrates a configuration including four transconductance stages, the teachings herein are applicable to configurations including more or fewer transconductance stages.

As shown in FIG. 2A, the first transconductance stage 11 includes a differential voltage input electrically connected to the non-inverting and inverting input voltage terminals $V_{IN+}$, $V_{IN-}$ through the first pair of input switches 21*a*, 21*b*, and a current output electrically connected to a current input of the output stage 16 through the first output switch 31. Additionally, the second transconductance stage 12 includes a differential voltage input electrically connected to the non-inverting and inverting input voltage terminals $V_{IN+}$, $V_{IN-}$ through the second pair of input switches 22*a*, 22*b*, and a current output electrically connected to the current input of the output stage 16 through the second output switch 32. Furthermore, the third transconductance stage 13 includes a differential voltage input electrically connected to the non-inverting and inverting input voltage terminals $V_{IN+}$, $V_{IN-}$ through the third pair of input switches 23*a*, 23*b*, and a current output electrically connected to the current input of the output stage 16 through the third output switch 33. Additionally, the fourth transconductance stage 14 includes a differential voltage input electrically connected to the non-inverting and inverting input voltage terminals $V_{IN+}$, $V_{IN-}$ through the fourth pair of input switches 24*a*, 24*b*, and a current output electrically connected to the current input of the output stage 16 through the fourth output switch 34. The output stage 16 further includes a voltage output electrically connected to the output voltage terminal $V_{OUT}$.

The autozero timing control circuit 15 receives a clock signal CLK, and generates control signals for controlling the operation of the first to fourth transconductance stages 11-14, the first to fourth pairs of input switches 21*a*-21*b*, 22*a*-22*b*, 23*a*-23*b*, 24*a*-24*b*, and the first to fourth output switches 31-34.

For example, the autozero timing control circuit 15 generates a first autozero control signal AZ1, which is provided to a first autozero circuit 19*a* of the first transconductance stage 11. Additionally, the autozero timing control circuit 15 generates a second autozero control signal AZ2, which is provided to a second autozero circuit 19*b* of the second transconductance stage 12. Furthermore, the autozero timing control circuit 15 generates a third autozero control signal AZ3, which is provided to a third autozero circuit 19*c* of the third transconductance stage 13. Additionally, the autozero timing control circuit 15 generates a fourth autozero control signal AZ4, which is provided to a fourth autozero circuit 19*d* of the fourth transconductance stage 14. Furthermore, the autozero timing control circuit 15 generates input switch control signals for the first to fourth pairs of input switches 21*a*-21*b*, 22*a*-22*b*, 23*a*-23*b*, 24*a*-24*b*, and output switch control signals for the first to fourth output switches 31-34.

The first to fourth transconductance stages 11-14 each have an autozero mode and an amplification mode, which can be selected by the first to fourth autozero control signals AZ1-AZ4, respectively. When a particular transconductance stage operates in the autozero mode, the autozero timing control circuit 15 can disconnect that transconductance stage from the amplifier's signal path. For instance, when the first transconductance stage 11 is being autozeroed, the autozero timing control circuit 15 can disconnect the first transconductance stage 11 from the amplifier's signal path by opening the first pair of input switches 21*a*, 21*b* and the first output switch 31. Similarly, the autozero timing control circuit 15 can selectively disconnect the second to fourth transconductance stages 12-14 from the amplifiers signal path using the second to fourth pair of input switches 22*a*-22*b*, 23*a*-23*b*, 24*a*-24*b* and the second to fourth output switches 32-34, respectively.

In certain configurations, when a particular transconductance stage is being autozeroed, the autozero timing control circuit 15 operates the remaining transconductance stages in the amplification mode such that the remaining transconductance stages operate in parallel to provide amplification.

For example, in the illustrated configuration, the first transconductance stage 11 can generate a first current $I_1$, the second transconductance stage 12 can generate a second current $I_2$, the third transconductance stage 13 can generate a third current $I_3$, and the fourth transconductance stage 14 can generate a fourth current $I_4$. Additionally, when the first transconductance stage 11 is being autozeroed, the output stage 16 can receive a current corresponding to the sum of second current $I_2$, the third current $I_3$, and the fourth current $I_4$. Furthermore, when the second transconductance stage 12 is being autozeroed, the output stage 16 can receive a current corresponding to a sum of the first current $I_1$, the third current $I_3$, and the fourth current $I_4$. Additionally, when the third transconductance stage 13 is being autozeroed, the output stage 16 can receive a current corresponding to a sum of the first current $I_1$, the second current $I_2$, and the fourth current $I_4$. Furthermore, when the fourth transconductance stage 14 is being autozeroed, the output stage 16 can receive a current corresponding to a sum of the first current $I_1$, the second current $I_2$, and the third current $I_3$.

Accordingly, the illustrated autozero amplifier 40 can autozero the first to fourth transconductance stages 11-14 using a staggered autozero sequence. Additionally, when a particular transconductance stage is being autozeroed, the remaining stages can provide amplification. Staggering autozeroing of the transconductance stages in this manner can result in a relatively large amount of the amplifier's amplification circuitry being active at any given time, and thus can reduce output glitches and/or noise associated with disconnecting or reconnecting amplifier stages into or out of the amplifier's signal path.

Figure 2B:
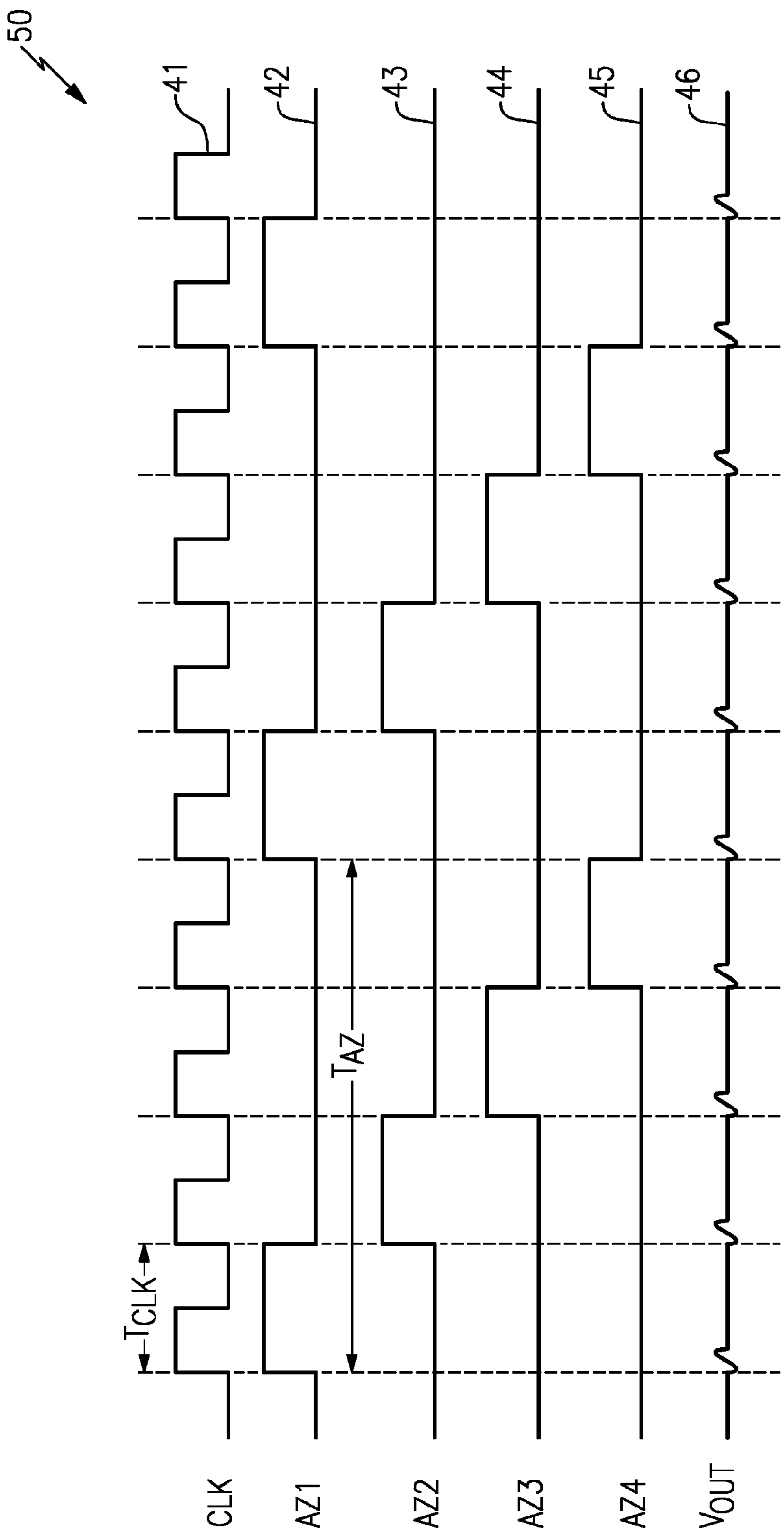
FIG. 2B is an example of a timing diagram for the autozero amplifier of FIG. 2A.

FIG. 2B is an example of a timing diagram 50 for the autozero amplifier 40 of FIG. 2A. The timing diagram 50 includes a first plot 41 of the clock signal CLK versus time, a second plot 42 of the first autozero control signal AZ1 versus time, a third plot 43 of the second autozero control signal AZ2 versus time, a fourth plot 44 of the third autozero control signal AZ3 versus time, a fifth plot 45 of the fourth autozero control signal AZ4 versus time, and a sixth plot 46 of the output voltage $V_{OUT}$ versus time.

Although FIG. 2B illustrates one example of a timing diagram of the autozero amplifier 40 of FIG. 2A, other configurations are possible.

In the illustrated configuration, the first clock signal CLK has a clock period $T_{CLK}$, which can be used to control transitions in the amplifier's autozero sequence. As shown in FIG. 2B, the first to fourth transconductance stages 11-14 can be regularly autozeroed with an autozero period $T_{AZ}$, which can be about four times greater than the clock period $T_{CLK}$ in this example. In one example, the first clock signal CLK has a clock rate in the range of about 1 kHz to about 50 MHz.

However, the clock rate can vary in a very broad range and other applicable clock rates will be readily determined by one of ordinary skill in the art. In addition, the autozeroing process can be repeated on an ongoing basis such that the various time intervals that activate the autozero mode for a particular transconductance stage can be repeated. For example, the various time intervals can correspond to phases or states of a state machine or counter with n states.

When a particular transconductance stage is autozeroed, that stage can be disconnected from the amplifier's signal path such that the input offset voltage can be reduced. For instance, with reference to FIGS. 2A-2B, when the first autozero control signal AZ1 is active, the first pair of input switches 21*a*, 21*b* and the first output switch 31 can be opened to disconnect the first transconductance stage 11 from the amplifier's signal path. Additionally, when the second autozero control signal AZ2 is active, the second pair of input switches 22*a*, 22*b* and the second output switch 32 can be opened to disconnect the second transconductance stage 12 from the amplifier's signal path. Furthermore, when the third autozero control signal AZ3 is active, the third pair of input switches 23*a*, 23*b* and the third output switch 33 can be opened to disconnect the third transconductance stage 13 from the amplifier's signal path. Additionally, when the fourth autozero control signal AZ4 is active, the fourth pair of input switches 24*a*, 24*b* and the fourth output switch 34 can be opened to disconnect the fourth transconductance stage 14 from the amplifier's signal path.

In the illustrated configuration, three of the four transconductance stages can operate in the amplifier's signal path at any given time. In certain embodiments, an autozero amplifier includes n transconductance stages, and n−1 transconductance stages provide amplification at any given time. Configuring the amplifier in this manner can result in the amplifier having relatively small output glitches. For instance, the output glitches shown in the sixth plot 46 associated with connecting amplification circuitry into and out of the amplifier's signal path can be relatively small. Although an amplifier can be configured to operate with n−1 transconductance stages providing amplification at any given time, other configurations are possible, such as configurations in which more than one transconductance stage can be disconnected from the amplifier's signal path at one or more time instances.

Although FIG. 2B illustrates one example a timing diagram associated with an autozero sequence that is fixed, the teachings herein are applicable to configurations in which the autozero sequence is random or pseudo-random. For example, one embodiment of an autozero amplifier having a random autozero sequence will be described below.

Figure 3:
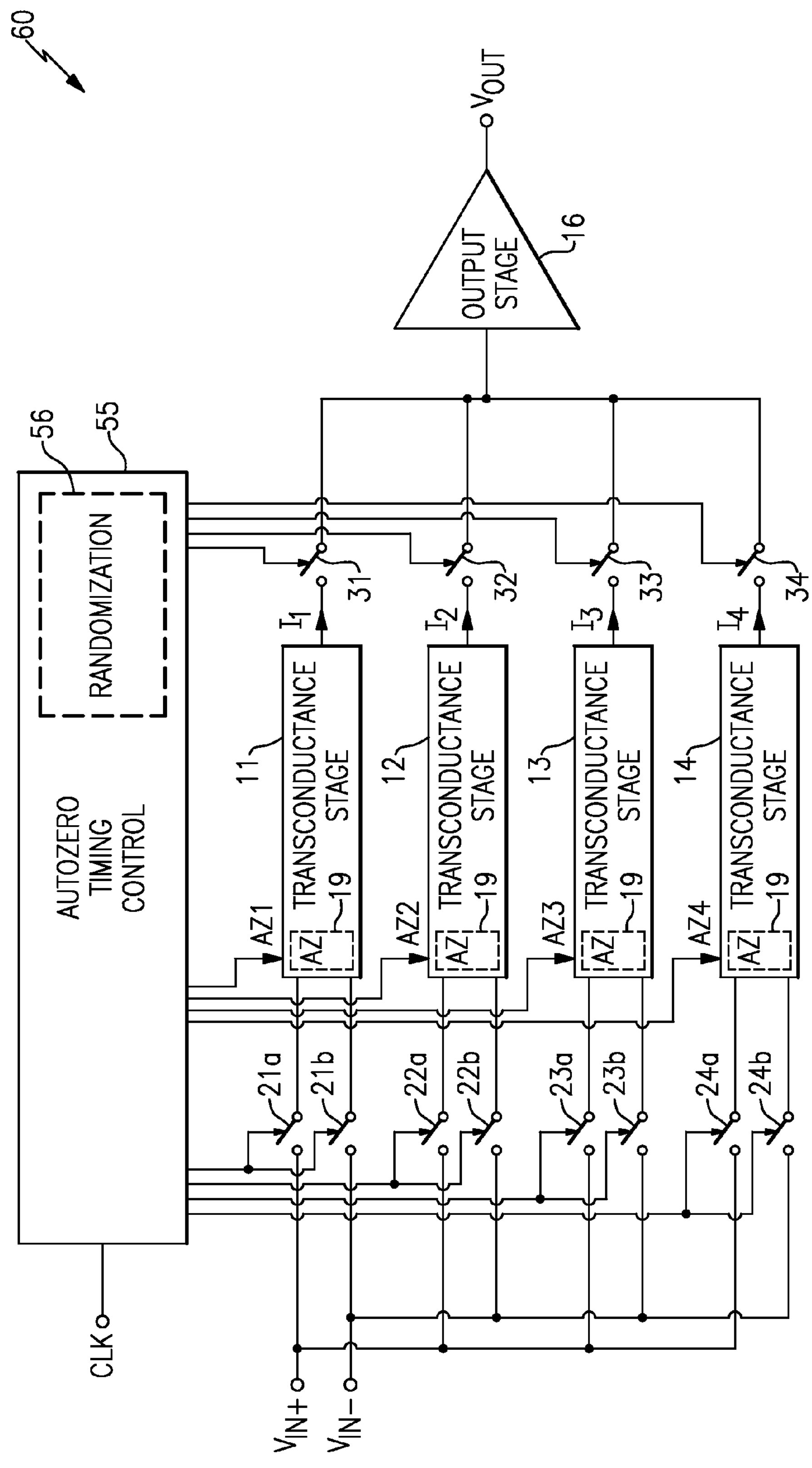
FIG. 3 is a schematic block diagram of another embodiment of an autozero amplifier.

FIG. 3 is a schematic block diagram of another embodiment of an autozero amplifier 60.

The autozero amplifier 60 of FIG. 3 is similar to the autozero amplifier 40 of FIG. 2A, except that the autozero amplifier 60 includes a different implementation of an autozero timing control circuit. In particular, the autozero amplifier 60 includes an autozero timing control circuit 55, which includes a randomization circuit 56.

The randomization circuit 56 can be used to randomize an autozero sequence of the first to fourth transconductance stages 11-14. As used herein, a randomized autozero sequence refers not only to an autozero sequence that is statistically random, but also to an autozero sequence that is pseudo-random.

In one embodiment, the randomization circuit 56 includes a pattern generator configured to generate random or pseudo-random bits, and the autozero control signals can be generated based on the clock signal CLK and the bit pattern. For instance, in a configuration include four transconductance stages, a transconductance stage can be selected for autozeroing by a randomization circuit that generates a 2-bit random or pseudo-random output that updates at a rate of the clock signal CLK.

Configuring the autozero timing control circuit 55 to include the randomization circuit 56 can aid in enhancing performance of the amplifier relative to a configuration in which the amplifier's autozeroing sequence is cyclic. For example, when an autozero amplifier includes transconductance stages that are repeatedly autozeroed at an autozero frequency, noise spurs can appear at the output at multiples of the autozero frequency. Accordingly, randomizing an autozero sequence can aid in enhancing performance of an autozero amplifier by reducing output noise.

Figure 4A:
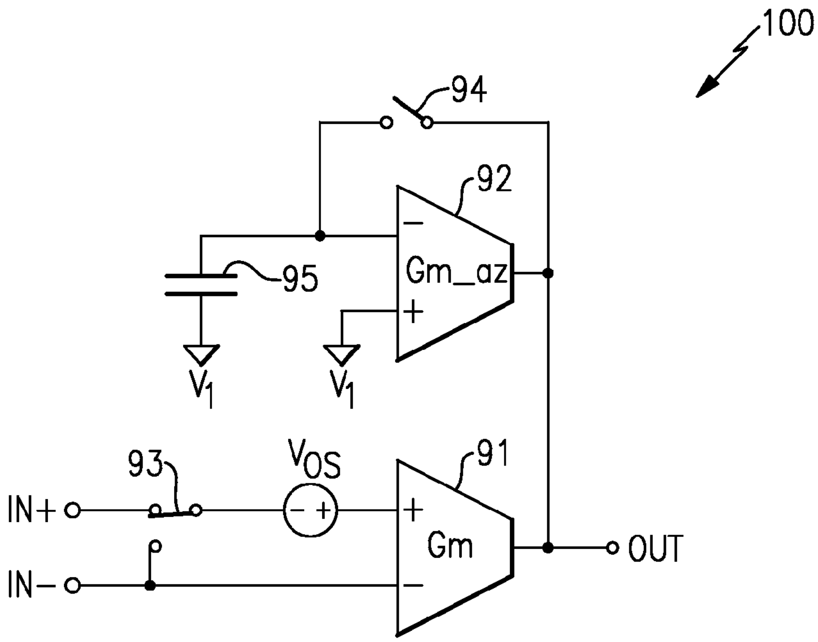
FIGS. 4A-4B are circuit diagrams illustrating two phases of a transconductance stage according to one embodiment.
Figure 4B:
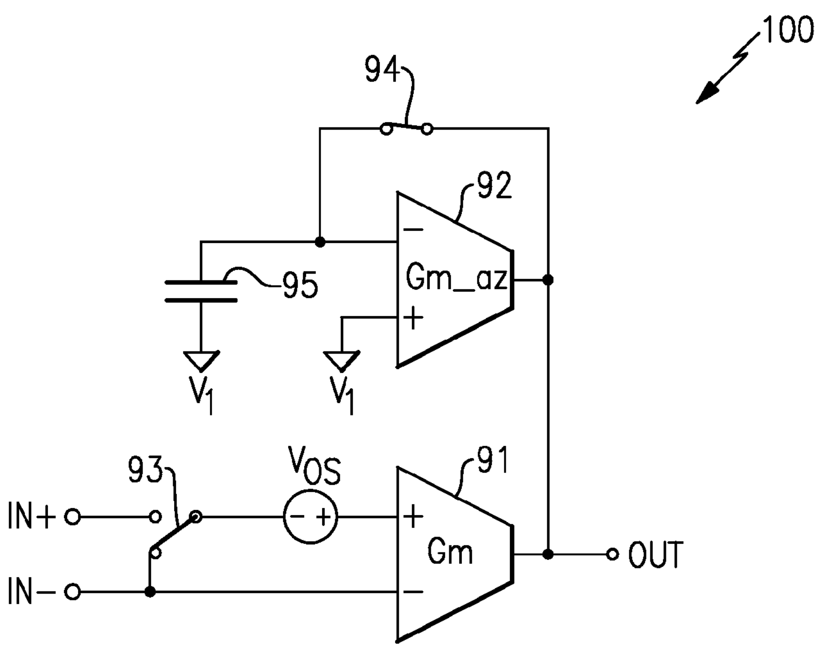

FIGS. 4A-4B are circuit diagrams illustrating two phases or modes of a transconductance stage 100 according to one embodiment.

The transconductance stage 100 includes a first transconductance amplification circuit or primary transconductor 91, an auxiliary transconductance amplification circuit or auxiliary transconductor 92, an input switch 93, a feedback switch 94, and an input offset correction capacitor 95. The transconductance stage 100 includes a first or non-inverting input node IN+, a second or inverting input node IN−, and an output node OUT.

The input switch 93 includes a first input electrically connected to the non-inverting input node IN+, a second input electrically connected to the inverting input node IN−, and an output electrically connected to a non-inverting input of the primary transconductor 91. Additionally, the primary transconductor 91 includes an inverting input electrically connected to the inverting input node IN−, and an output electrically connected to the output node OUT. The auxiliary transconductor 92 includes an output electrically connected to an input of the feedback switch 94, to the output of the primary transconductor 91, and to the output node OUT. The auxiliary transconductor 92 further includes a non-inverting input electrically connected to a first voltage $V_1$, and an inverting input electrically connected to an output of the feedback switch 94 and to a first end of the input offset correction capacitor 95. The input offset correction capacitor 95 further includes a second end electrically connected to the first voltage $V_1$, which can be, for example, a ground or power low reference voltage.

Although not illustrated in FIGS. 4A-4B for clarity, the state of the input switch 93 and the feedback switch 94 can be controlled by an autozero timing control circuit. For example, when the first to fourth transconductance stages 11-14 of the amplifier 40 of FIG. 2A are implemented using the illustrated transconductance stage 100, the mode in which the transconductance stage 100 operates can be controlled by the autozero timing control circuit 15.

As shown in FIGS. 4A-4B, a voltage source $V_{OS}$ has been illustrated between the output of the input switch 93 and the non-inverting input of the primary transconductor 91. The voltage source $V_{OS}$ can represent an input offset voltage of the primary transconductor 91. The input offset voltage can arise from a variety of sources, including, for example, process variation associated with fabricating the primary transconductor's differential transistor input pair.

In the illustrated configuration, the input switch 93 and the feedback switch 94 can be used to control the electrical connectivity of the transconductance stage 100 to operate in a first or amplification mode shown in FIG. 4A or in a second or autozero mode shown in FIG. 4B. For example, during the amplification mode shown in FIG. 4A, the input switch 93 can be used to electrically connect the primary transconductor's non-inverting input to the non-inverting input node IN+, and the feedback switch 94 can be in an open or high impedance state. Additionally, during the autozero mode shown in FIG. 4B, the input switch 93 can be used to electrically connect the primary transconductor's non-inverting and inverting inputs to the inverting input node IN−, and the feedback switch 94 can be used to electrically connect the auxiliary transconductor's output to the auxiliary transconductor's inverting input.

During the autozero mode, the primary transconductor 91 can generate an output current corresponding to the amplifier's input offset voltage. For example, when the primary transconductor 91 has a transconductance Gm and an input offset voltage $V_{OS}$, the primary transconductor 91 can generate an output current of about $Gm*V_{OS}$ during the autozero mode. Additionally, during the autozero mode, the auxiliary transconductor 92 is connected with negative feedback, which can control the voltage of the inverting input of the auxiliary transconductor 92 to a steady-state condition in which the auxiliary transconductor 92 generates an offset compensation current having about equal magnitude and opposite polarity as the primary transconductor's output current.

The voltage of the auxiliary transconductor's inverting input associated with generating the offset compensation current can be stored across the input offset correction capacitor 95. Accordingly, when the transconductance stage 100 operates in the amplification mode, the auxiliary transconductor 92 generates the offset compensation current, thereby compensating for the primary transconductor's input offset voltage. For example, after the transconductance stage 100 has been autozeroed, substantially no current can flow into or out of the output node OUT when the voltage difference between the non-inverting input node IN+ and the inverting input node IN− is about equal to 0 V.

Although the transconductance stage 100 of FIGS. 4A-4B illustrates one implementation of a transconductance stage in accordance with the teachings herein, other configurations are possible. For example, the teachings herein can be applicable to other configurations of autozeroing, including, for example, feed-forward autozero correction schemes.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. Examples of the electronic devices can include, but are not limited to, consumer electronic products, parts of the consumer electronic products, electronic test equipment, medical imaging and monitoring, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:

a plurality of transconductance stages comprising:
- a first transconductance stage;
- a second transconductance stage; and
- a third transconductance stage, wherein each of the first transconductance stage, the second transconductance stage, and the third transconductance stage have an autozero mode and an amplification mode;

an autozero timing control circuit configured to operate the first transconductance stage in the autozero mode during a first time interval, to operate the second transconductance stage in the autozero mode during a second time interval, and to operate the third transconductance stage in the autozero mode during a third time interval, wherein the first time interval, the second time interval, and the third time interval are staggered in time, wherein the autozero timing control circuit is further configured to control an autozero sequence of the plurality of transconductance stages, wherein the autozero timing control circuit comprises a randomization circuit configured to randomize the autozero sequence to have a random or pseudo random order.

2. The apparatus of claim 1, wherein at least one transconductance stage of the plurality of transconductance stages is configured to provide amplification during the first time interval, during the second time interval, and during the third time interval.

3. The apparatus of claim 2, wherein the autozero timing control circuit is further configured to operate the second and third transconductance stages in the amplification mode during the first time interval, wherein the autozero timing control circuit is further configured to operate the first and third transconductance stages in the amplification mode during the second time interval, and wherein the autozero timing control circuit is further configured to operate the first and second transconductance stages in the amplification mode during the third time interval.

4. An apparatus comprising:

a plurality of transconductance stages comprising:
- a first transconductance stage;
- a second transconductance stage; and
- a third transconductance stage, wherein each of the first transconductance stage, the second transconductance stage, and the third transconductance stage have an autozero mode and an amplification mode;

an autozero timing control circuit configured to operate the first transconductance stage in the autozero mode during a first time interval, to operate the second transconductance stage in the autozero mode during a second time interval, and to operate the third transconductance stage in the autozero mode during a third time interval, wherein the first time interval, the second time interval, and the third time interval are staggered in time;

a differential input voltage terminal;

a first pair of input switches electrically connected between the differential input voltage terminal and a differential input of the first transconductance stage;

a second pair of input switches electrically connected between the differential input voltage terminal and a differential input of the second transconductance stage; and a third pair of input switches electrically connected between the differential input voltage terminal and a differential input of the third transconductance stage.

5. The apparatus of claim 4, wherein the autozero timing control circuit is further configured to control an autozero sequence of the plurality of transconductance stages, wherein the autozero sequence has a fixed order.

6. The apparatus of claim 4, further comprising:

an output voltage terminal;

an output stage including an input and an output, wherein the output is electrically connected to the output voltage terminal;

a first output switch electrically connected between an output of the first transconductance stage and the input of the output stage, wherein the autozero timing control circuit is further configured to open the first output switch when the first transconductance stage operates in the autozero mode, and to close the first output switch when the first transconductance stage operates in the amplification mode;

a second output switch electrically connected between an output of the second transconductance stage and the input of the output stage, wherein the autozero timing control circuit is further configured to open the second output switch when the second transconductance stage operates in the autozero mode, and to close the second output switch when the second transconductance stage operates in the amplification mode; and a third output switch electrically connected between an output of the third transconductance stage and the input of the output stage, wherein the autozero timing control circuit is further configured to open the third output switch when the third transconductance stage operates in the autozero mode, and to close the third output switch when the third transconductance stage operates in the amplification mode.

7. An apparatus comprising:

a plurality of transconductance stages comprising:

a first transconductance stage;

a second transconductance stage; and a third transconductance stage, wherein each of the first transconductance stage, the second transconductance stage, and the third transconductance stage have an autozero mode and an amplification mode;

an autozero timing control circuit configured to operate the first transconductance stage in the autozero mode during a first time interval, to operate the second transconductance stage in the autozero mode during a second time interval, and to operate the third transconductance stage in the autozero mode during a third time interval, wherein the first time interval, the second time interval, and the third time interval are staggered in time, wherein the first transconductance stage comprises a primary transconductor, an auxiliary transconductor, and an input offset correction capacitor, wherein when the first transconductance stage operates in the amplification mode the primary transconductor provides amplification, and wherein when the first transconductance stage operates in the autozero mode the auxiliary transconductor corrects for an input offset voltage of the primary transconductor by storing an offset correction voltage across the input offset correction capacitor.

8. The apparatus of claim 1, wherein the plurality of transconductance stages further comprises a fourth transconductance stage, wherein the autozero timing control circuit is further configured to operate the fourth transconductance stage in the autozero mode during a fourth time interval, wherein the first time interval, the second time interval, the third time interval, and the fourth time interval are staggered in time.

9. The apparatus of claim 1, wherein the plurality of transconductance stages comprises four or more transconductance stages.

10. A method of electronic amplification comprising:

providing a differential input voltage to an autozero amplifier comprising a plurality of transconductance stages, wherein the plurality of transconductance stages comprise a first transconductance stage, a second transconductance stage, and a third transconductance stage;

controlling timing of the plurality of transconductance stages using an autozero timing control circuit;

autozeroing the first transconductance stage during a first time interval using the autozero timing control circuit;

autozeroing the second transconductance stage during a second time interval using the autozero timing control circuit;

autozeroing the third transconductance stage during a third time interval using the autozero timing control circuit, wherein the first time interval, the second time interval, and the third time interval are staggered in time;

controlling an autozero sequence of the plurality of transconductance stages using the autozero timing control circuit; and randomizing the autozero sequence to have a random or pseudo random order using a randomization circuit of the autozero timing control circuit.

11. The method of claim 10, further comprising:

amplifying the differential input voltage using at least one transconductance stage during the first time interval, during the second time interval, and during the third time interval.

12. The method of claim 11 further comprising:

amplifying the differential input voltage using at least the second and third transconductance stages during the first time interval;

amplifying the differential input voltage using at least the first and third transconductance stages during the second time interval; and amplifying the differential input voltage using at least the first and second transconductance stages during the third time interval.

13. The method of claim 12, further comprising:

providing the differential input voltage to the first transconductance stage through a first pair of input switches during the second and third time intervals;

opening the first pair of input switches during the first time interval;

providing the differential input voltage to the second transconductance stage through a second pair of input switches during the first and third time intervals;

opening the second pair of input switches during the second time interval;

providing the differential input voltage to the third transconductance stage through a third pair of input switches during the first and second time intervals; and opening the third pair of input switches during the third time interval.

14. The method of claim 13, further comprising:

generating a first current using the first transconductance stage during the second and third time intervals;

generating a second current using the second transconductance stage during the first and third time intervals;

generating a third current using the third transconductance stage during the first and second time intervals; and generating a summed current based on the first current, the second current, and the third current.

15. The method of claim 14, further comprising converting the summed current to an output voltage using an output stage.

16. The method of claim 10, wherein autozeroing the first transconductance stage comprising storing an input offset correction voltage across an input offset correction capacitor.

17. The method of claim 10, wherein the plurality of transconductance stages comprises four or more transconductance stages.

18. An autozero amplifier comprising:

a differential input voltage terminal configured to receive a differential input voltage;

a plurality of transconductance stages comprising a first transconductance stage, a second transconductance stage, and a third transconductance stage; and an autozero timing control circuit configured to control an autozero sequence of the plurality of transconductance stages, wherein the autozero timing control circuit comprises a randomization circuit configured to randomize the autozero sequence to have a random or pseudo random order, wherein the autozero timing control circuit is configured to autozero the first transconductance stage during a first time interval, to autozero the second transconductance stage during a second time interval, and to autozero the third transconductance stage during a third time interval, wherein the first time interval, the second time interval, and the third time interval are different time intervals, wherein during operation of the autozero amplifier at least one transconductance stage of the plurality of transconductance stages is configured to amplify the differential input voltage at any given time.

19. The autozero amplifier of claim 18, further comprising:

an output voltage terminal; and an output stage configured to control a voltage of the output voltage terminal based on a sum of a plurality of currents, wherein the plurality of currents are generated by the plurality of transconductance stages.

20. The autozero amplifier of claim 18, wherein at least the second and third transconductance stages are configured to amplify the differential input voltage during the first time interval, wherein at least the first and third transconductance stages are configured to amplify the differential input voltage during the second time interval, and wherein at least the second and third transconductance stages are configured to amplify the differential input voltage during the third time interval.

21. The autozero amplifier of claim 18, wherein the plurality of transconductance stages comprises four or more transconductance stages.

22. The apparatus of claim 4, wherein the autozero timing control circuit is further configured to open the first pair of input switches when the first transconductance stage operates in the autozero mode, and to close the first pair of input switches when the first transconductance stage operates in the amplification mode, wherein the autozero timing control circuit is further configured to open the second pair of input switches when the second transconductance stage operates in the autozero mode, and to close the second pair of input switches when the second transconductance stage operates in the amplification mode, and wherein the autozero timing control circuit is further configured to open the third pair of input switches when the third transconductance stage operates in the autozero mode, and to close the third pair of input switches when the third transconductance stage operates in the amplification mode.

23. The method of claim 15, further comprising generating an output signal using the output stage, wherein the output signal is based on a plurality of currents of the plurality of transconductance stages.

24. The apparatus of claim 1, wherein the autozero amplifier further comprises an output stage configured to generate an output signal based on a plurality of currents of the plurality of transconductance stages.

25. The apparatus of claim 7, wherein the autozero sequence has a fixed order.

26. The apparatus of claim 18, wherein the autozero amplifier further comprises an output stage configured to generate an output signal based on a plurality of currents of the plurality of transconductance stages.

* * * * *